(12) United States Patent
Mauder et al.

(10) Patent No.: US 6,714,397 B2
(45) Date of Patent: Mar. 30, 2004

(54) PROTECTION CONFIGURATION FOR SCHOTTKY DIODE

(75) Inventors: Anton Mauder, Kolbermoor (DE); Roland Rupp, Lauf (DE); Erich Griebl, Dorfen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/213,419

(22) Filed: Aug. 5, 2002

(65) Prior Publication Data

US 2003/0035259 A1 Feb. 20, 2003

Related U.S. Application Data

(63) Continuation of application No. PCT/EP01/00497, filed on Jan. 17, 2001.

(30) Foreign Application Priority Data

Feb. 4, 2000 (DE) .......................................... 100 04 983

(51) Int. Cl.$^7$ ................................................ H02H 9/08
(52) U.S. Cl. ...................................................... 361/93.9
(58) Field of Search ...................... 361/93.9, 98, 100, 361/101, 91.5; 327/314, 320, 503

(56) References Cited

U.S. PATENT DOCUMENTS

| | | | | |
|---|---|---|---|---|
| 4,679,251 A | * | 7/1987 | Chown | 455/619 |
| 5,087,871 A | * | 2/1992 | Losel | 323/299 |
| 5,789,311 A | * | 8/1998 | Ueno et al. | 438/573 |
| 5,801,519 A | * | 9/1998 | Midya et al. | 323/222 |
| 5,986,832 A | * | 11/1999 | Barnet | 360/46 |

FOREIGN PATENT DOCUMENTS

| | | |
|---|---|---|
| DE | 197 40 542 C1 | 12/1998 |
| EP | 0 646 964 A1 | 4/1995 |
| EP | 0 741 412 A2 | 11/1996 |
| EP | 0 768 748 A2 | 4/1997 |
| EP | 0 741 412 A3 | 7/1997 |
| FR | 2 689 317 | 10/1993 |

OTHER PUBLICATIONS

Witzel et al., Silicon Carbide High–Power Devices, IEEE Transactions on Electronic Devices, v. 43, No 10, Oct. 1996.*

International Search Report, dated May 8, 2001.

* cited by examiner

Primary Examiner—Brian Sircus
Assistant Examiner—Z Kitov
(74) Attorney, Agent, or Firm—Laurence A. Greenberg; Werner H. Stemer; Ralph E. Locher

(57) ABSTRACT

A protection device for a Schottky diode is described. The protection device has a cascade circuit with at least two Si-PIN diodes provided parallel to the Schottky diode. The protection device protects against momentary over-current pulses reliably and without a high outlay in terms of cost and necessary materials for forming the protection device.

10 Claims, 3 Drawing Sheets

PROTECTION CONFIGURATION FOR SCHOTTKY DIODE

CROSS-REFERENCE TO RELATED APPLICATION

This application is a continuation of copending International Application No. PCT/EP01/00497, filed Jan. 17, 2001, which designated the United States and was not published in English.

BACKGROUND OF THE INVENTION

Field of the Invention

The present invention relates to a configuration for protecting a Schottky diode against momentary over-current pulses.

In numerous applications of diodes in which the latter are operated in a rapid sequence alternately in the reverse direction and in the forward direction, a minimum storage charge is sought in the diodes since switching losses are caused by the charge during recommutation of the diodes. In this respect, then, Schottky diodes are distinctly superior to diodes with a PN junction, that is to say PN diodes and PIN diodes, since, as is known, the Schottky diodes have no flooding charge in the semiconductor body. For this reason Schottky diodes are preferably used per se in applications in which diodes are operated in a rapid sequence alternately in the reverse direction and in the forward direction.

However, owing to the band structure of the customary semiconductor material silicon and of the Schottky contacts applied thereto, only a maximum reverse voltage of about 200 V can be applied to Schottky diodes with tenable reverse currents. Compared with Schottky diodes made of silicon, Schottky diodes made of semiconductor materials with a large band gap, such as silicon carbide (SiC), for example, have the advantage of a considerably higher reverse voltage. Thus, the reverse voltage can reach values in excess of 1700 V in the case of SiC.

A method for producing a SiC diode is described in U.S. Pat. No. 5,789,311, for example.

In Schottky diodes, given a constant current I, a diode forward voltage Vf increases with the temperature T of the Schottky diode, in which case, by way of example, in the case of SiC, a resistance R thereof is approximately proportional to $T^{2.5}$. As a result, the power loss rises in the Schottky diode, which leads to further heating. When a critical current applied over a fixed time is exceeded, the result is thus a strong non-linear increase in the diode forward voltage Vf.

This relationship is shown in FIG. 5, in which the diode forward voltage Vf is plotted as a function of the diode forward current If for three different diodes at a temperature of 25° C. and twice at a temperature of 100° C. In this case, the diodes used were SiC Schottky diodes configured for 4 A (DC or direct current), to which sinusoidal over-current pulses were applied for a time of 10 ms in each case and the peak values of the diode forward voltage Vf were measured. Current values at which destruction of the diode occurred are indicated by black points.

As is known, momentary aperiodic over-current spikes can occur in a wide variety of electronic circuits. This is the case, for example, if backup capacitors are charged when such an electronic circuit is switched on. The components that are stressed by such over-current spikes must be configured for these aperiodic loads. They are therefore generally over dimensioned, which, however, impairs the further dynamic properties of the components and leads to higher costs for the latter.

An unprotected power factor correction (PFC) stage of a switched-mode power supply shall be mentioned as an example. In the case of such a PFC stage, after the power supply has been switched on, the MOSFET switches are initially turned off, the backup capacitor being charged in this state. As an example, the capacitance of the backup capacitor may be up to about 220 $\mu$F in the case of a switched-mode power supply configured for 300 W. The current flowing via the diode of the PFC stage then reaches a maximum of up to 70 A, and the $I^2t$ load can assume values of the order of magnitude of in excess of $4A^2s$, as can also be seen from FIG. 6, in which the input voltage of a 300 W power supply and the diode current of the Si-PIN diode of the power supply are plotted as a function of the time t after switch-on.

At the present time, various measures are usually taken into consideration in order to protect Si-PIN diodes or the power supply system against switch-on spikes.

First, it is conceivable to subject the diodes to over dimensioning, so that they at all events withstand current spikes that are to be expected. However, such over dimensioning results in an increase in the storage charge, which entails increased switching losses during operation and higher device costs.

Furthermore, a NTC thermistor can be connected in series with the diodes. By way of example, it is possible to use NTC thermistors with cold resistances of about 10 Ω in order to reduce switch-on current spikes in power supplies with a higher power above 250 W, in order that power supply disturbances and triggering of automatic protection devices are avoided. However, when such NTC thermistors are used, a residual resistance of about 0.5 Ω for a 300 W power supply results in the operating state, which leads to an additional steady-state power loss of approximately 1 W at the NTC thermistor.

In higher quality power supplies, it is also possible to use so-called "bootstrap" resistors which, in a manner similar to NTC thermistors, are connected in series with the diodes. A semiconductor switch connected in parallel with the bootstrap resistors, such as, in particular, an insulated gate bipolar transistor (IGBT) or a thyristor, then short-circuits the bootstrap resistor after a switch-on. Such a measure is relatively complicated, but practically no additional power loss occurs in normal operation.

As has already been mentioned in the introduction, Schottky diodes have the advantage of an extremely low recovery charge. "Wide Band Gap" Schottky diodes, based on semiconductor materials with a large band gap, additionally achieve high reverse voltages with small leakage currents. For this reason, the use of, for example, SiC Schottky diodes in PFC stages of switched-mode power supplies is a possibility—which has already been taken into consideration for a relatively long time—for realizing operation alternating in a rapid sequence in the reverse direction and in the forward direction in the case of such switched-mode power supplies. This leads to minimized dynamic losses in comparison with conventional PIN diodes.

However, since such Schottky diodes react extremely sensitively to high switch-on currents, as has already been mentioned in the introduction, they should always be protected against such switch-on current spikes.

The protection measures taken into consideration above for PIN diodes pose particular problems, when used for Schottky diodes.

A high degree of over dimensioning of the diode area is critical not so much because of the increasing storage charge but more because of the costs of the basic material for the Schottky diodes. In particular, this applies to compound semiconductors such as SiC, for example.

With the use of an NTC thermistor, by way of example, for the protection of an SiC Schottky diode with a continuous current of 4 A for a 300 W power supply, an NTC thermistor with a cold resistance of 20 Ω is required in order that the Sic diode can be effectively protected, as experiments have shown. However, such an NTC thermistor significantly increases the power loss in normal operation. Moreover, an NTC thermistor would always have to be incorporated even in lower-power power supplies. Furthermore, with the use of an NTC thermistor, it is necessary to comply with a delay of approximately 10 s when switch-on is effected again, during which delay the NTC thermistor can cool down.

The use of a bootstrap resistor is readily possible in theory. In practice, however, it is ruled out for cost reasons in most applications.

Finally, in particular in the case of semiconductor materials with a large band gap, it would also be conceivable to surround the Schottky diode by, for example, a P$^+$-doped protective ring. However, this measure is associated with a significant increase in the area requirement for the chip of the Schottky diode by about 20%. The high wafer costs for such semiconductor materials and the need for further process steps restrict the applicability of this solution.

SUMMARY OF THE INVENTION

It is accordingly an object of the invention to provide a protection configuration for a Schottky diode which overcomes the above-mentioned disadvantages of the prior art devices of this general type, which can protect the latter against momentary over-current pulses reliably and without a high outlay.

With the foregoing and other objects in view there is provided, in accordance with the invention, a configuration for protecting a Schottky diode against momentary over-current pulses. The configuration contains a series circuit having at least two diodes, selected from the group consisting of Si-PIN diodes and Si-PN diodes, disposed in parallel with the Schottky diode. The Schottky diode is produced from a semiconductor material having a band gap greater than a band gap of silicon.

The Schottky diode preferably contains a compound semiconductor and has a large band gap. A suitable semiconductor material is SiC. However, it is also possible to use GaN, for example.

Thus, in the case of the configuration according to the invention, sufficient protection of the Schottky diode is ensured by connecting in parallel two series-connected Si-PIN (or Si-PN) diodes, which applies in particular to operation with a switch-on current. However, it is also to possible to use more than two Si-PIN or Si-PN diodes. The PIN (or PN) diodes accept the main proportion of the current at the latest in the current range for which the Schottky diode exhibits a great rise in the diode forward voltage Vf (see FIG. 5). In normal operation, a voltage Vf of about 1.4 V is dropped across a SiC Schottky diode, for example. The PIN (or PN) diodes are then not active (the threshold voltage of Si-PN diodes is approximately 0.73 V, so that the voltage assumes a value of about 1.46 V in the case of two diodes connected in series), and only a negligibly small additional storage charge is obtained by them.

In accordance with an added feature of the invention, the Schottky diode is produced from a compound semiconductor. More specifically, the Schottky diode is produced from SiC or GaN.

In accordance with an additional feature of the invention, a silicon body is provide and the at least two diodes are integrated in the silicon body. A further Schottky diode can be disposed in series with the at least two diodes in the silicon body.

In accordance with another feature of the invention, a housing is provided, and the Schottky diode and the at least two diodes are disposed together in the housing.

In accordance with a further feature of the invention, a switched-mode power supply having a power factor correction (PFC) stage is provided, and the Schottky diode and the at least two diodes are disposed in the PFC stage of the switched-mode power supply.

In accordance with a further added feature of the invention, the further Schottky diode connected in series with the at least two diodes is also disposed in the housing or the PFC stage.

In accordance with a concomitant feature of the invention, the series circuit having the at least two diodes has an N-doped layer with a surface breakdown charge being less than $1.8 \times 10^{12}$ cm$^2$ charge carriers.

Other features which are considered as characteristic for the invention are set forth in the appended claims.

Although the invention is illustrated and described herein as embodied in a protection configuration for a Schottky diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
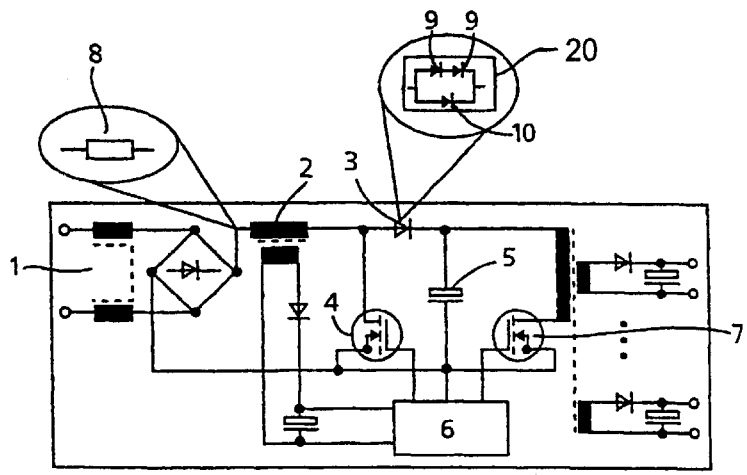
FIG. 1 is a circuit diagram of the basic construction of a switched mode power supply with a PFC stage according to the invention.

Referring now to the figures of the drawing in detail and first, particularly, to FIG. 1 thereof, there is shown the basic construction of a switched-mode power supply with a PFC stage. A bridge circuit, an inductor 2 and a diode device 3 are connected downstream of an input 1. The diode device 3 is connected to a switching transistor 4 and to a backup capacitor 5. A controller 6 is connected to gate electrodes of the switching transistor 4 and of a further switching transistor 7. It controls and measures a charge state of the backup capacitor 5 and controls the switched-mode power supply.

Moreover, an NTC thermistor 8 may additionally be connected upstream of the inductor 2.

According to the invention, a parallel circuit formed by a series circuit containing two Si-PIN (or PN) diodes 9 with a Schottky diode 10 is used for the diode device 3. A SiC Schottky diode, for example, may be used for the Schottky diode 10. The diodes 9 and the Schottky diode 10 can be contained in a separate housing 20.

The basic functioning of a PFC stage is described for example in the reference by M. Herfurth, titled "Power Factor Controller TDA 4862 Applications", Siemens AT2 9402 E.

As has already been explained in the introduction, as a result of the two series-connected Si-PIN diodes 9 being connected in parallel with the Schottky diode 10, the Schottky diode 10 is relieved of the switch-on current. The PIN-diodes 9 accept the main proportion of the current at the latest in the current range for which the Schottky diode exhibits a great increase in the forward voltage Vf. During normal operation, a voltage Vf of only about 1.4 V is dropped across a SiC Schottky diode, for example. The Si-PIN diodes 9 are then not active in the case of a threshold voltage of 2×0.73 V=1.46 V, and only a negligibly small additional recovery charge is obtained by them.

Figure 2A:
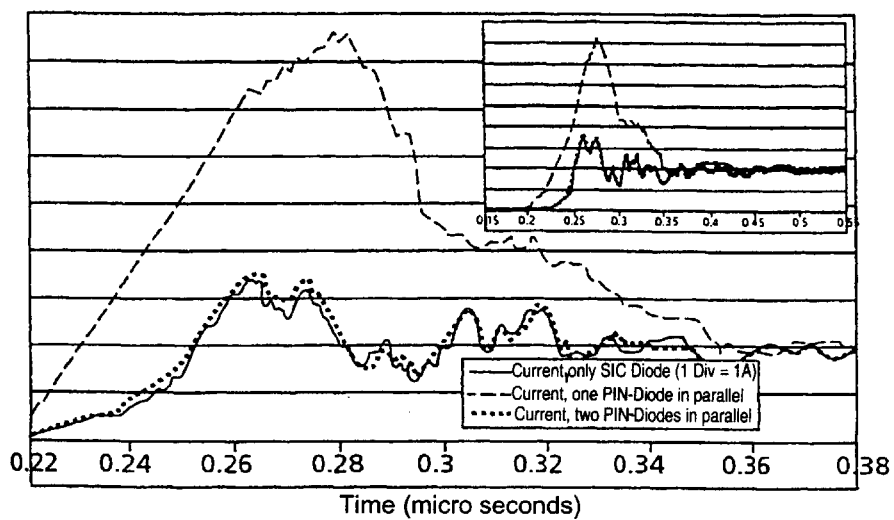
FIGS. 2a and 2b are graphs showing a profile of reverse current spikes in a case of various diode configurations during an operation of the PFC stage, one or two Si-PIN diodes being able to be connected in parallel with an SiC diode.
Figure 2B:
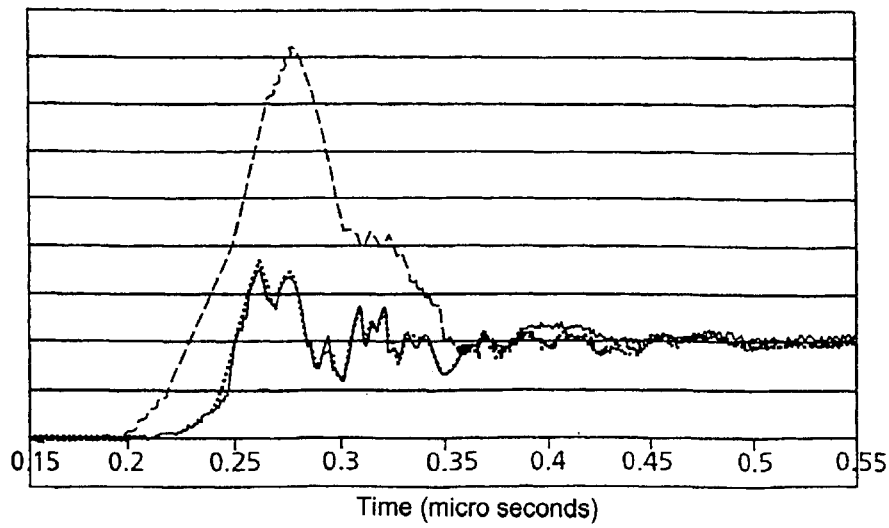

FIGS. 2a and 2b show switching curves which are obtained with the switched-mode power supply of FIG. 1 configured for 300 W. FIG. 2a illustrates a the temporal profile from 0.22 µs to 0.38 µs and FIG. 2b the temporal profile from 0.15 µs to 0.55 µs after a switching operation, and FIG. 2b being projected onto FIG. 2a, top right, for comparison purposes.

If the diode 10 is a SiC Schottky diode and if only one Si-PIN diode is connected in parallel with it (see the dashed-line curve profile), then the diode 9 is switched on and causes a corresponding reverse current spike. In contrast, if two series-connected Si-PIN (or PN) diodes are connected in parallel with the SiC Schottky diode (see the dotted-line curve profile), then no switch-on is effected and the storage charge is comparable with that with no further diode circuitry see the solid-line curve profile).

Figure 3:
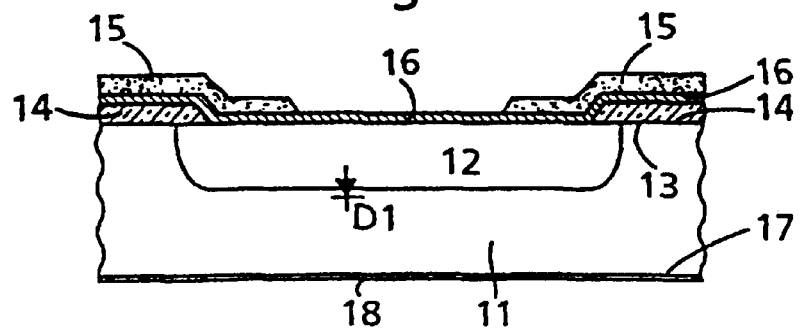
FIG. 3 is a diagrammatic, sectional view showing the construction of a conventional Si-PIN diode.

FIG. 3 shows a conventional PN high-voltage diode for 600 V with an n⁻-conducting silicon semiconductor body 11, into which a p-conducting zone 12 is introduced by diffusion, for example. An edge oxide layer 14, a polyimide layer 15 and a metal contact layer 16 made of aluminum, for example, are situated on a first surface 13 of the semiconductor body 11 or the zone 12. A further metal contact layer 18 is provided on a second surface 17 of the semiconductor body 11 that is opposite to the first surface 13. The diode itself is represented by a symbol D1 at the PN junction.

Figure 4A:
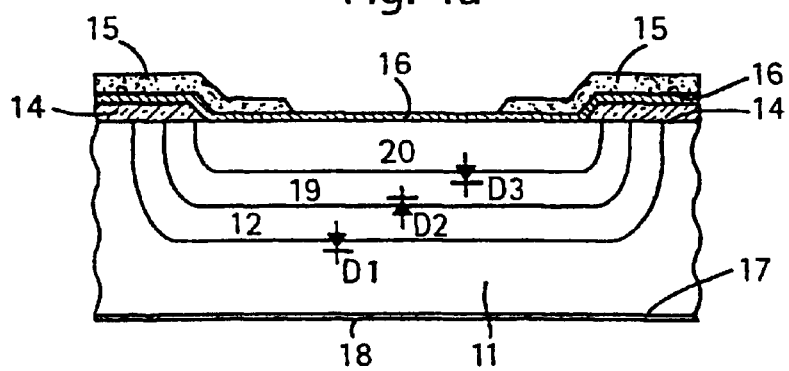
FIGS. 4a and 4b are sectional views showing the construction of a Si double diode (FIG. 4a) and a double diode in which one doping region is replaced by a Schottky contact (FIG. 4b) according to the invention.

As is shown in FIG. 4a, according to the invention a further N-doped layer 19 is applied to the conventional high-voltage diode, which takes up the voltage in the blocking case. A doping dose of the layer 19 is smaller than that of a surface breakdown charge and lies below (1.3 ... 1.8) $10^{12}$ cm$^{-2}$.

A diode D2 that forms between the layer 19 and the zone 12 is reverse-biased if the diode D1 lies in the forward direction. Afterward, a p⁺-conducting layer 20 is additionally introduced into the layer 19.

It shall be noted that the layers 19, 20 and the zone 12 can be produced in each case by diffusion and/or ion implantation.

With the layer 20, a diode D3 forms between the layer and the layer 19. The diode D3 is forward-biased with the diode D1 if the diode D2 is disposed in the reverse direction.

Figure 4B:
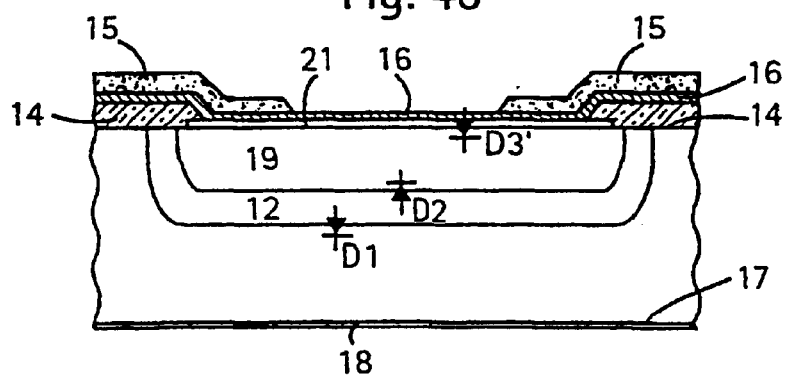
Figure 5:
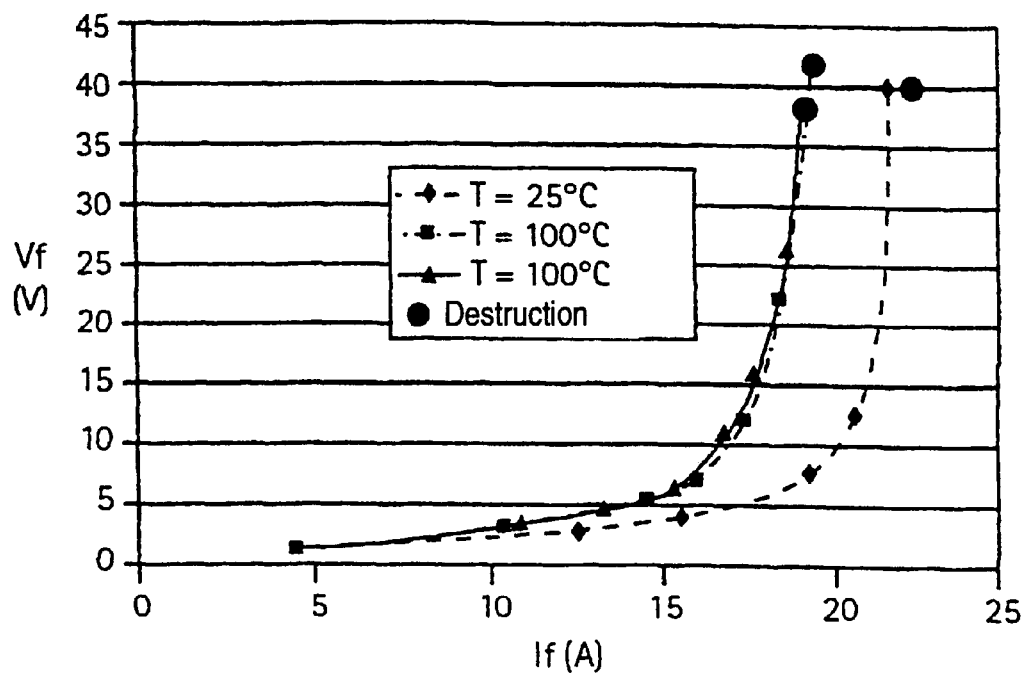
FIG. 5 is a graph showing the profile of the diode forward voltage Vf as a function of the diode forward current If.
Figure 6:
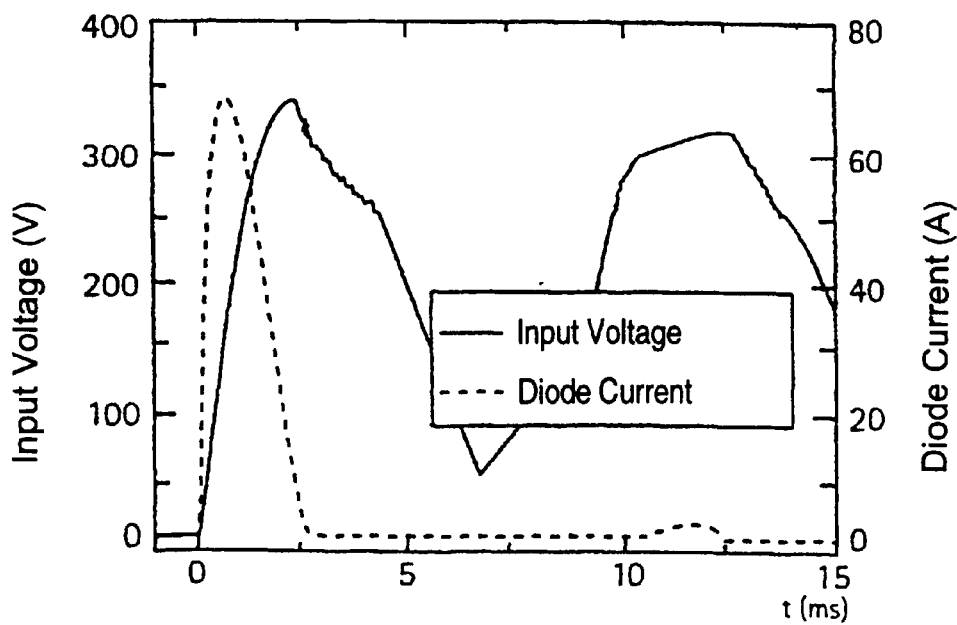
FIG. 6 is a graph showing a current and voltage profile during the switch-on of a 300 W power supply using a Si-PIN diode.

Instead of the layer 20, it is also possible, if appropriate, to apply a Schottky contact 21 which forms the diode D3 (see FIG. 4b). The layer or the region 20 can then be omitted.

In the case of the configuration shown in FIG. 4a, a space charge zone forms in the p-conducting and n-conducting layers 19, 20 and the p-conducting zone 12. If the n-conducting layer 19 is depleted of charge carriers, then the space charge zone penetrates through from the PN junction between the zone 12 and the layer 19 to the layer 20. The punch-through voltage in the forward direction can even be set, within specific limits, by the dopings and the width of the N-conducting layer 19.

The Schottky diode 10 and the Si-PIN (or PN) diodes 9 can be accommodated either as individual chips or as Si double diode (see FIGS. 4a, 4b) in a housing, which considerably facilitates the mounting of the configuration.

In the case of compound semiconductors, the outlay for the Si double diode is readily compensated for by the reduction of the area that is possible for such a Schottky diode as a result of the complete avoidance of an overcurrent.

In the above exemplary embodiment, the two diodes D1 and D3 are connected in series. If appropriate, even further diodes can be provided in series therewith, so that, in parallel with the Schottky diode, a plurality of Si-PIN or -PN diodes are connected in series. As is shown in FIGS. 4a and 4b, the Si-PIN or -PN diodes can readily be integrated in a semiconductor body.

We claim:

1. A configuration having protection against momentary over-current pulses, comprising:
   a Schottky diode; and
   a series circuit containing at least two diodes, selected from the group consisting of Si-PIN diodes and Si-PN diodes, disposed in parallel with said Schottky diode, said Schottky diode being produced from a semiconductor material having a band gap greater than a band gap of silicon.

2. The configuration according to claim 1, wherein said Schottky diode contains a compound semiconductor.

3. The configuration according to claim 1, wherein said Schottky diode contains a material selected from the group consisting of SiC and GaN.

4. The configuration according to claim 1, further comprising a silicon body and said at least two diodes are integrated in said silicon body.

5. The configuration according to claim 1, further comprising;
   a silicon body; and
   a further Schottky diode disposed in series with said at least two diodes in said silicon body.

6. The configuration according to claim 5, further comprising a housing and said Schottky diode and said at least two diodes are disposed together in said housing.

7. The configuration according to claim 1, further comprising a switched-mode power supply having a power factor correction (PFC) stage, and said Schottky diode and said at least two diodes are disposed in said PFC stage of said switched-mode power supply.

8. The configuration according to claim 6, wherein said further Schottky diode connected in series with said at least two diodes is also disposed in said housing.

9. The configuration according to claim 7, wherein said further Sohottky diode connected in series with said at least two diodes is also disposed in said PFC stage.

10. The configuration according to claim 1, wherein said series circuit having said at least two diodes has an N-doped layer with a surface breakdown charge being less than $1.8 \times 10^{12}$ cm$^2$ charge carriers.

* * * * *